US010002812B2

(12) United States Patent
Göbl et al.

(10) Patent No.: US 10,002,812 B2
(45) Date of Patent: Jun. 19, 2018

(54) POWER SEMICONDUCTOR MODULE HAVING A PRESSURE APPLICATION BODY AND ARRANGEMENT THEREWITH (71) Applicant: Semikron Elektronik GmbH & Co., KG, Nürnberg (DE)

(72) Inventors: Christian Göbl, Nürnberg (DE); Clemens Vennebusch, Nürnberg (DE)

(73) Assignee: Semikron GmbH & Co., KG, Nürnberg (DE)

(*) Notice: Subject to any disclaimer, the term of this patent is extended or adjusted under 35 U.S.C. 154(b) by 0 days. days.

(21) Appl. No.: 15/422,274

(22) Filed: Feb. 1, 2017

(65) Prior Publication Data
US 2017/0221785 A1    Aug. 3, 2017

(30) Foreign Application Priority Data

Feb. 1, 2016  (DE) .......... 10 2016 101 724
Oct. 14, 2016  (DE) .......... 10 2016 119 631

(51) Int. Cl.
*H01L 23/28*      (2006.01)
*H01L 23/10*      (2006.01)
*H01L 23/049*     (2006.01)
(Continued)

(52) U.S. Cl.
CPC ............ *H01L 23/10* (2013.01); *H01L 23/049* (2013.01); *H01L 23/053* (2013.01);
(Continued)

(58) Field of Classification Search
CPC .............. H01L 2924/181; H01L 51/5016
See application file for complete search history.

(56) References Cited

U.S. PATENT DOCUMENTS 5,136,471 A * 8/1992 Inasaka .............. H01L 23/5385
                                                              174/255
5,793,106 A * 8/1998 Yasukawa ........... H01L 23/3121
                                                              257/706
(Continued)

FOREIGN PATENT DOCUMENTS

DE    196 30 173 A1    1/1998
DE    199 55 100 A1    11/2000
(Continued)

OTHER PUBLICATIONS

Office Action from the German Patent Office in oe of the priority cases, dated Aug. 19, 2016.

*Primary Examiner* — Thao P Le
(74) *Attorney, Agent, or Firm* — The Law Offices of Roger S. Thompson (57) ABSTRACT A power semiconductor module having a pressure application body, a circuit carrier, which is embodied with a first conductor track, a power semiconductor element arranged thereon and an internal connecting device, and also having a housing which is embodied with a guide device arranged therein, with a connecting element. The connecting element is embodied as a bolt with first and second end sections and an intermediate section therebetween, wherein the first end section rests on the circuit carrier and is electrically conductively connected thereto; the second end section projects out of the housing through a cutout; and wherein the connecting element is arranged in the assigned guide device. The pressure application body has a first rigid partial body and a second elastic partial body, wherein the second partial body protrudes out of the first partial body in the direction of the housing.

20 Claims, 4 Drawing Sheets (51) Int. Cl.
  *H01L 23/40* (2006.01)
  *H01L 23/495* (2006.01)
  *H01L 23/00* (2006.01)
  *H01L 25/065* (2006.01)
  *H01L 23/053* (2006.01)

(52) U.S. Cl.
  CPC ...... *H01L 23/4006* (2013.01); *H01L 23/4951* (2013.01); *H01L 23/49517* (2013.01); *H01L 23/49531* (2013.01); *H01L 23/49568* (2013.01); *H01L 23/49575* (2013.01); *H01L 24/48* (2013.01); *H01L 25/0655* (2013.01); *H01L 2023/405* (2013.01); *H01L 2023/4025* (2013.01); *H01L 2023/4087* (2013.01); *H01L 2224/48245* (2013.01); *H01L 2224/48472* (2013.01)

(56) References Cited

U.S. PATENT DOCUMENTS

| | | | |
|---|---|---|---|
| 6,791,170 B1 | 9/2004 | Fuku | |
| 8,992,267 B2 | 3/2015 | Bayerer | |
| 2001/0015478 A1 | 8/2001 | Tsunoda | |
| 2010/0284155 A1* | 11/2010 | Stolze | H01L 23/3121 361/728 |
| 2011/0256749 A1* | 10/2011 | Bayerer | H01R 12/585 439/345 |

FOREIGN PATENT DOCUMENTS

| | | |
|---|---|---|
| DE | 10 2011 088 322 A1 | 6/2012 |
| DE | 10 2013 104 950 B3 | 4/2014 |

* cited by examiner

POWER SEMICONDUCTOR MODULE HAVING A PRESSURE APPLICATION BODY AND ARRANGEMENT THEREWITH

BACKGROUND OF THE INVENTION

1. Field of the Invention

The invention is directed to a power semiconductor module having a pressure application body, having a circuit carrier which is embodied with a first conductor track, a power semiconductor component arranged thereon, and having an internal connecting device. The power semiconductor module also has a housing having a guide device arranged therein, in particular for a connecting element which serves to connect the circuit carrier to an external connecting device, in particular an external circuit board with load current conductor tracks. In addition, the power semiconductor module has a pressure application body for applying pressure to the circuit carrier. In an arrangement with this power semiconductor module, the pressure body serves for bringing about thermal and mechanical connection of the circuit carrier to a cooling device.

2. Description of the Related Art

Figure 8:
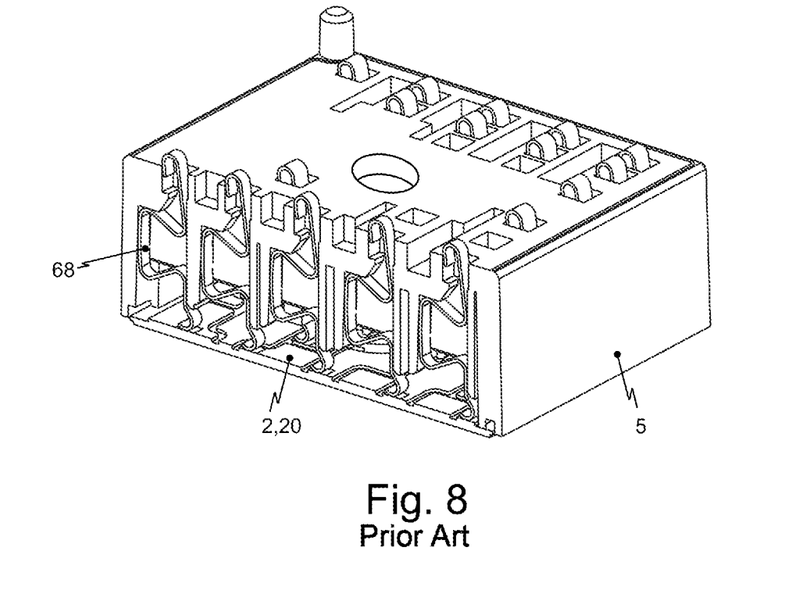
FIG. 8 shows a power semiconductor module according to the prior art described above.

The prior art, disclosed, for example, in German Patent Application No. DE 196 30 173 A1 and illustrated basically in FIG. 8 hereof, discloses a power module composed of semiconductor components and passive electronic components, which power module permits, in the case of pressure-contacting of all the load connections and control connections to a customized circuit board or their similar outer connecting elements, simple mounting on a cooling device by means of screws and destruction-free removal therefrom. For this purpose, the housing 5 of the module is provided with pressure contact springs 68 which exhibit a favorable relaxation behavior, for all electrical connections and for the purpose of uniform pressure distribution. For test purposes and during use, the modules are configured in a functionally capable fashion between a pressure element and a heat sink by clamping to at least one attachment element, a pressure application body. A deficiency with such configurations is the limited current carrying capacity of the known pressure contact springs 68, which capacity is correspondingly approximately 10 A in the prior art.

SUMMARY OF THE INVENTION

It is an object of the invention is to provide an improved power semiconductor module which has an essentially higher current carrying capacity of the connecting elements than heretofore known, without loss of flexibility or compactness.

According to the invention, the power semiconductor module is embodied having: a pressure application body; a circuit carrier, which is embodied with a first conductor track, a power semiconductor component arranged thereon and an internal connecting device; a housing which is embodied with a guide device arranged therein, and with a connecting element. The connecting element is embodied as a bolt with a first and a second end section and an intermediate section embodied between them, wherein the first end section rests on the circuit carrier and is electrically conductively connected thereto, wherein the second end section projects out of the housing through a cutout, and wherein the connecting element is arranged in the assigned guide device. The pressure application body has here a first rigid partial body, preferably composed of a first insulating material, and a second elastic partial body, preferably composed of a second insulating material, wherein the second partial body protrudes out of the first partial body in the direction of the housing. The pressure application body and the housing are preferably embodied in two pieces. The feature according to which the second partial body protrudes out of the first partial body in the direction of the housing is therefore obviously satisfied only in the case of correct use. The power semiconductor module is embodied in such a way that the second partial body applies pressure to a circuit board, on a side facing away from the housing, preferably in a planar fashion, which circuit board is, in the case of correct use of the power semiconductor module, arranged between the pressure application body and the housing together with the connecting element and therefore also between the second partial body and the second end section. In other words, the power semiconductor module is embodied in such a way that in the case of correct use a circuit board is arranged between the second partial body and the second end section. The second partial body is therefore designed to exert pressure, preferably in a planar fashion, in the direction of the assigned connecting element, wherein the pressure is applied longitudinally into the connecting element.

The intermediate section preferably has, as that part of the connecting element with the minimum cross-sectional area, a cross-sectional area from about 0.5 mm$^2$ to about 10 mm$^2$, in particular from about 0.75 mm$^2$ to about 5 mm$^2$. A cross-sectional area of 2.5 mm$^2$ is sufficient here for a current carrying capacity of approximately 100 A.

It is preferred that at least one of the end sections of the connecting element has a contact face with a surface shape which is embodied in a planar or convex fashion. In this case, the contact face can have a structured surface, preferably having a concentric annular structure. The topology of this structure preferably has a difference in height from about 5 µm to about 50 µm, preferably from about 10 µm to about 25 µm, and a distance between the structures of from about 75 µm to about 500 µm, preferably from about 150 µm to about 250 µm.

In particular, it is preferred if at least one of the end sections, in particular the second end section, of the connecting element is embodied in a substantially mushroom-like fashion.

It is preferred if the connecting element is embodied from copper or an alloy which mainly contains copper, that is to say has more than 50% of copper mass, and also preferably has a surface coating made of silver or an alloy which mainly contains silver.

In one advantageous refinement, the guide device is designed to clamp the assigned connecting element in such a way that it is secured against dropping out, wherein the guide device has at least one, preferably three, clamping devices with clamping faces which clamp the connecting element at its intermediate section.

The first partial body of the pressure application body preferably has a cutout from which the second partial body protrudes. In particular, in this context the first partial body of the pressure application body is composed of a high-temperature-resistant thermoplastic, in particular made of polyphenylenesulphide, in particular having a metallic reinforcement structure. The second partial body is preferably composed of a silicone rubber, in particular made of liquid silicone.

It is particularly preferred if the pressure application body is designed in such a way that, in the case of correct use, the second partial body is arranged flush, or substantially flush, with the guide device.

In a further preferred refinement of the power semiconductor module, a pressure-transmitting element, which is embodied so as to be basically identical to the connecting element, but made from an electrically insulating material, is configured in a further guide device. This pressure-transmitting element then serves exclusively to form mechanical, but not electrical, contact.

The arrangement according to the invention is embodied with an aforementioned power semiconductor module having a cooling device, having a circuit board and having a clamping device for pressure-connecting these components, wherein the circuit carrier is pressure-contacted to the cooling device, that is to say in a frictionally locking fashion, and is therefore connected in a thermally conductive fashion, and wherein the second end section of the connecting element is connected in a mechanically and electrically conductive and pressure-contacted fashion, that is to say in turn in a frictionally locking fashion, to a second conductor track of the circuit board. It is particularly preferred here if the second partial body of the pressure application body is arranged flush, or essentially flush, with the guide device.

A pressure-contacted mechanical connection is also understood to be here a direct, immediate connection such as connection which has an intermediate layer, in particular a thermally conductive, thin intermediate layer.

A particularly advantageous embodiment of the arrangement is embodied in that the pressure application body, the circuit board, the housing and the circuit carrier each have a continuous cutout, and the cooling device has a cutout with an internal thread, wherein the clamping device which is embodied as a screw extends through the cutouts in the pressure application body, the circuit board, the housing and the circuit carrier and is screwed to the internal thread, as a result of which pressure is applied to the pressure application body, and on via the second partial body to the circuit board, and from the latter to the second end section, in direct mechanical and electrical contact with the circuit board, of the connecting element and from the first end section thereof to the circuit carrier which is in direct mechanical and electrical contact therewith, and on to the cooling device.

Basically, other conventional clamping devices, which are embodied as screws or clamping bolts and do not require a continuous cutout in the circuit carrier but instead are arranged in the cutout which is arranged on an outer side of the housing, can also be part of the arrangement.

A further particularly advantageous embodiment of the arrangement is embodied in that the pressure application body, the circuit board, the housing together with the circuit carrier and the cooling device are clamped by means of at least two clamping springs which comprise the pressure application body, the circuit board and the housing together with the circuit carrier and are supported in the cooling device, as a result of which pressure is applied to the pressure application body and on via the second partial body to the circuit board, and from the latter to the second end section, in direct mechanical and electrical contact with the circuit board, of the connecting element, and from the first end section thereof to the circuit carrier which is in direct mechanical and electrical contact therewith, and on to the cooling device.

Other objects and features of the present invention will become apparent from the following detailed description of the presently preferred embodiments, considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
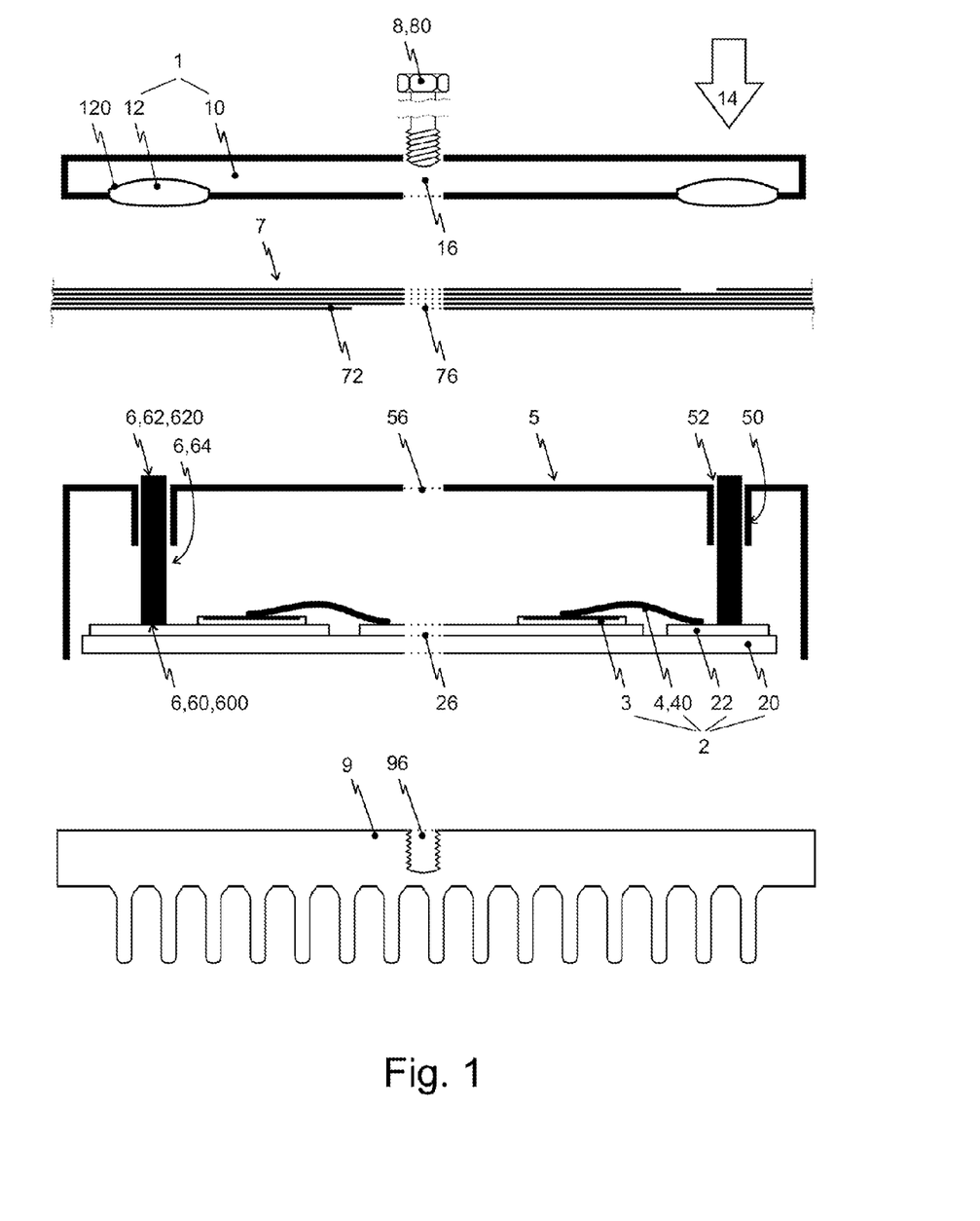
FIG. 1 shows a first refinement of a power semiconductor module according to the invention in a first arrangement according to the invention.

FIG. 1 shows a first refinement of a power semiconductor module according to the invention in a first arrangement according to the invention in an exploded illustration. The arrangement has here the following components: a clamping device 8, a pressure application body 1 of the power semiconductor module, a circuit board 7, a housing 5 of the power semiconductor module with circuit carrier 2 arranged therein, and a cooling device 9. Circuit board 7 is arranged here between housing 5 and pressure application body 1.

Cooling device 9 is embodied as an air cooling device with a cutout 96 which has an internal thread. Housing 5 of the power semiconductor module is embodied here in a beaker-like fashion and covers circuit carrier 2 towards cooling device 9. Housing 5 has two guide devices 50 in each of which an assigned connecting element 6 is arranged here.

Circuit carrier 2 is embodied with a substrate 20 which has conductor tracks 22 with separated potential from one another. Power semiconductor components 3 are arranged on these conductor tracks 22 and are connected by their first contact faces in an electrically conductive fashion to the respectively assigned conductor track 22. An internal connecting device 4 is embodied here as a multiplicity of conventional wire bonding connections 40 which connect second contact faces of power semiconductor components 3 in each case to a first conductor track 22 or (not illustrated) to second contact faces of other power semiconductor components with appropriate circuitry.

Connecting elements 6 are each embodied as a bolt with a first and a second end section 60, 62 and an intermediate section 64 embodied between them. The bolts illustrated here are embodied in their entirety as a cylinder or hollow cylinder with a cross-sectional area of about 3 mm$^2$ and are composed of copper with a surface coating made of silver. First end section 30, embodied here in a planar fashion, has here a contact region 600 of connecting element 6 for connecting with circuit carrier 2, to be more precise with a contact face of circuit carrier 2, wherein the latter can be, as illustrated and preferred, part of a first conductor track 22 or else part of a second contact face of a power semiconductor component 3. The respective connecting element 6 which is arranged in assigned guide devices 50 projects out of housing 5 through a cutout 52, as a result of which second end section 62, also of planar design, of connecting element 6 forms, in particular by means of its contact face 620, the external contact device of the power semiconductor module. Guide device 50 is, without restriction of the generality, embodied here in one piece with housing 5. Likewise it extends up to the outer side of housing 5 and to cutout 52 there.

Second end section 62, to be more precise its contact face 620, is designed to be in mechanical and electrical contact with a second conductor track 72, a conductor track of circuit board 7. This second conductor track 72 is designed here to connect the power semiconductor module to load potentials and auxiliary potentials, such as control potentials or sensor potentials.

Also illustrated is pressure application body 1 of the power semiconductor module. The latter has a rigid first partial body 10 composed of a first insulating material and second partial bodies 12 which protrude therefrom in the direction of housing 5 and are composed of a second insulating material. First partial body 10 is embodied here from polyphenylene sulphide and also has, when necessary, an additional metallic reinforcement structure which is injection molded into it or arranged in a cutout provided in it for this purpose, cf. FIG. 7. Second partial bodies 12 are embodied elastically from a silicone rubber, here what is referred to as a cross-linked liquid silicone rubber or alternatively from what is referred to as a cross-linked solid silicone rubber. In a conventional way, these second partial bodies 12 are arranged in cutouts 120 in first partial body 10 and protrude therefrom. Second partial bodies 12 are arranged flush with guide devices 50 and therefore also with connecting element 6.

Clamping device 8 is embodied here as an individual screw 80 which extends through cutouts 16, 76, 56, 26, flush with one another, in pressure application body 1, circuit board 7, housing 5 together with circuit carrier 2 and engages in cutout 96, also flush, of cooling device 9. A pressure connection of the specified components is achieved by the pressure application by means of this clamping device 8. In this context, second partial bodies 12 of pressure application body 1 press flush with guide devices 50 of housing 5 onto circuit board 7, to be more precise onto the side thereof facing away from housing 5 and in the direction of connecting element 6 assigned to the respective partial body 12. In this context, a partial body 12 can also be assigned to a plurality of connecting elements 6. Circuit board 7 transmits the pressure 14 to second end section 62 of connecting element 6, as a result of which a pressure-contacted, that is to say frictionally locking, mechanical and also electrically conductive connection is embodied between second end section 62 and a second conductor track 72 of circuit board 7, wherein the second conductor track 72 is arranged on the side of circuit board 7 facing housing 5.

The respective connecting element 6 serves to conduct current between second conductor track 72 of circuit board 7 and circuit carrier 2. A pressure-contacted, that is to say frictionally locking, mechanical and also electrically conductive connection is also formed for this purpose between first end section 60 of connecting element 6 and the assigned contact face of circuit carrier 2 by means of clamping device 8.

Furthermore, circuit carrier 2 is pressed onto cooling device 9 by the mechanical transmission of force by means of connecting element 6, as a result of which said circuit carrier 2 and cooling device 9 are mechanically connected in a frictionally locking fashion. As a result, a projecting thermal coupling of circuit carrier 2 and therefore also of power semiconductor components 3 to cooling device 9 is achieved. In the arrangement according to the invention, connecting element 6 of the power semiconductor module has the triple advantage of forming two electrical contacts and one thermal contact.

If it is additionally necessary to further improve the thermal contact between circuit carrier 2 and cooling device 9, additional pressure-transmitting elements can also be arranged in further guide devices 50, and pressure can be applied to said pressure-transmitting elements by means of clamping device 8. These pressure-transmitting elements are equivalent in their shape to connecting elements 6 but are, however, formed from electrically insulating material. The term "same shape" is to be understood as meaning, in particular, a basically identical or very similar geometric refinement. It is not necessary here for connecting elements 6 and pressure application elements to have the same coefficient of thermal expansion, due to the flexible application of pressure by means of second partial bodies 12 of pressure application body 1.

Figure 2:
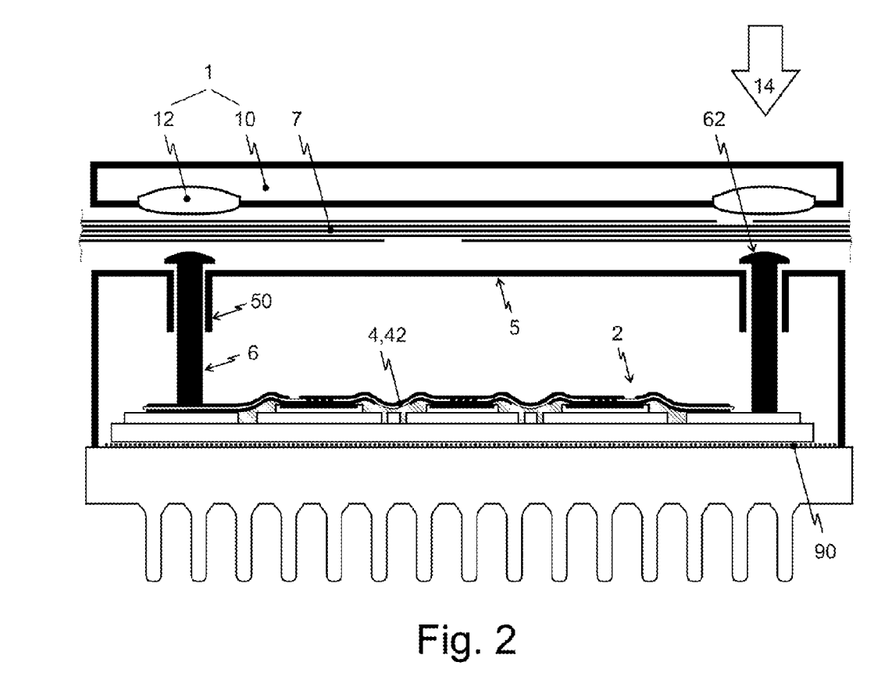
FIG. 2 shows a second refinement of a power semiconductor module according to the invention in a second arrangement according to the invention.

FIG. 2 shows a second refinement of a power semiconductor module according to the invention in a second arrangement according to the invention, wherein for reasons of clarity pressure application body 1 and circuit board 7 are illustrated slightly spaced apart from adjacent components.

Pressure application body 1 is embodied functionally and materially in the same way as that according to a first refinement with the exception of the cutout for leading through a screw. The same applies to circuit board 7 and housing 5.

In this refinement, circuit carrier 2 has, as an internal connecting device 4, a conventional film stack 42 made of electrically conductive and electrically insulating films which are structured themselves and have passages therethrough. Connecting elements 6 and, if appropriate, additionally present pressure application bodies are connected in an electrically conductive fashion to connecting device 4 or to a first conductor track 22 of circuit carrier 2 here.

Figure 3:
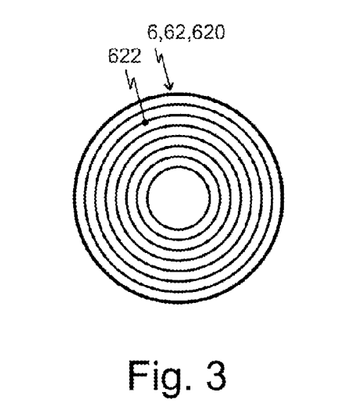
FIG. 3 shows a contact face of an end section of a connecting element.

The respective second end section 62 of connecting elements 6 is embodied here in a substantially mushroom-like fashion in order to reduce the risk of damage to the contact faces of the second conductor tracks 72 of circuit board 7. In addition, second end section 62 has a concentric annular structure 622 which is illustrated in FIG. 3 and counteracts a possible movement, induced by thermal loading, in the plane of circuit board 7. First end sections 60 of connecting elements 6 are embodied here, without restricting the generality, in a planar fashion and without structure, since the contact faces of circuit carrier 2 are embodied in a more robust fashion and therefore there is no risk of damage. The selection of first end section depends therefore on the refinement of the circuit carrier.

Cooling device 9 is in turn embodied as an air cooling device. A thin, pasty and thermally conductive substance 90 is arranged between circuit carrier 2 and cooling device 9.

Figure 4:
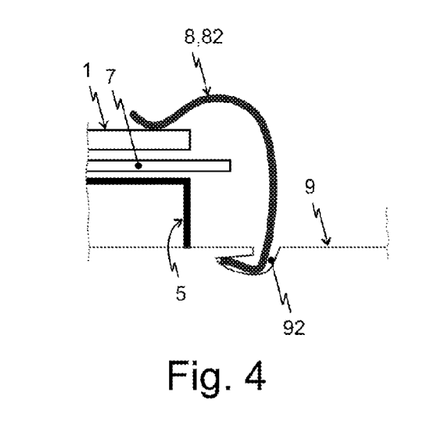
FIG. 4 shows a clamping device of a second arrangement according to the invention.

FIG. 4 shows a clamping device 8, embodied as a clamping spring 82 of a second arrangement according to the invention. For this purpose, cooling device 9 has cutouts 92 for supporting the clamping spring 82. The clamping spring 82 itself surrounds pressure application body 1, circuit board 7 and housing 5 together with circuit carrier 2. The principle of action is identical to that of the first arrangement with the exception of the specified different pressure application.

Figure 5:
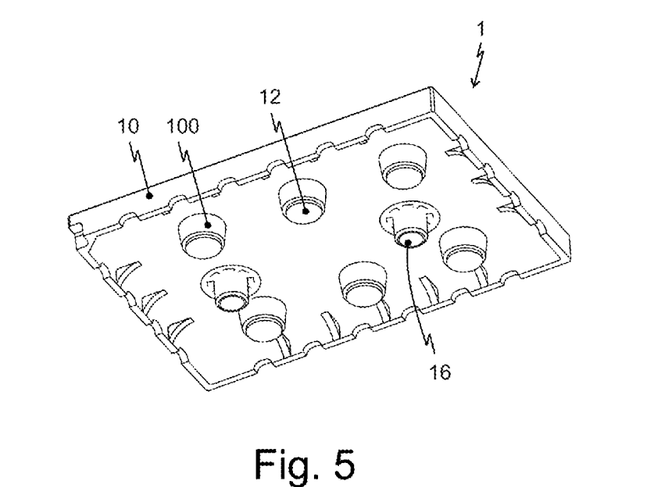
FIG. 5 shows a pressure application body of a power semiconductor module according to the invention.

FIG. 5 shows a pressure application body 1, embodied materially and functionally as described above under FIG. 1, of a power semiconductor module according to the invention. This pressure application body 1 has a rigid first partial body 10 with two cutouts 16 for leading through clamping devices 8 which are preferably embodied as screws 80. Also illustrated are six domes 100 with cutouts 120 located therein, cf. accordingly FIG. 1, of first partial body 10, in which cutouts 120 the respective second partial bodies 12 are arranged and from which the latter project in the direction of housing 5. This partial body 12 is, as described above, designed to exert pressure 14 on a circuit board 7 which can be arranged in accordance with FIG. 7 with respect to the power semiconductor module, wherein this circuit board 7 is arranged between pressure application body 1 and housing 5 together with connecting element 6 and therefore also between second partial body 12 and second end section 62 of connecting element 6.

Figure 6:
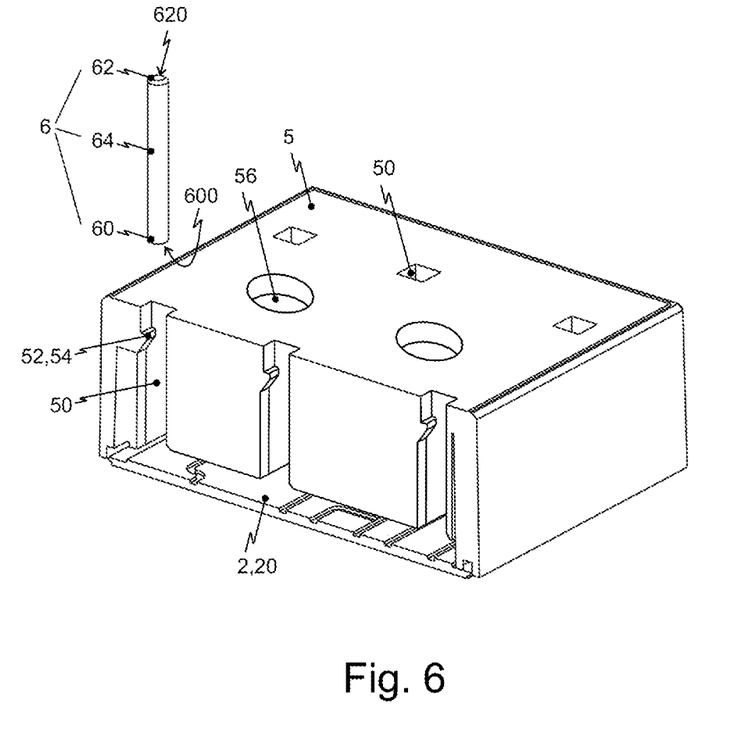
FIG. 6 shows a cross section through a power semiconductor module according to the invention.

FIG. 6 shows a cross section through a power semiconductor module according to the invention, without the pressure application body. Housing 5 has six shaft-like guide devices 50 which are provided for the arrangement of connecting elements 6. These guide devices 50 have here a square cross section, while connecting elements 6, of which only one is illustrated, are cylindrical and are therefore embodied with a circular cross section. As a result of this refinement it is sufficient if one clamping device 52 is provided with a clamping face 54 in order to secure connecting element 6 against dropping out. Of course, the clamping force which is applied here is not sufficient to impede the functionality of connecting element 6 within the scope of the arrangement according to the invention.

Basically, in the case of cylindrical connecting elements 6 guide devices can also have a round, in particular a circular, cross section. However, in this case three clamping devices which are arranged in a star shape and have clamping faces are then preferably provided in each case for protecting against the dropping out of the connecting element.

The beaker-shaped housing 5 also has a circuit carrier 2 described already above with respect to FIG. 1, and two cutouts 56 which are flush with cutouts in pressure application body 1, illustrated by way of example in FIG. 5, for the arrangement of a clamping device which is embodied as screws.

Figure 7:
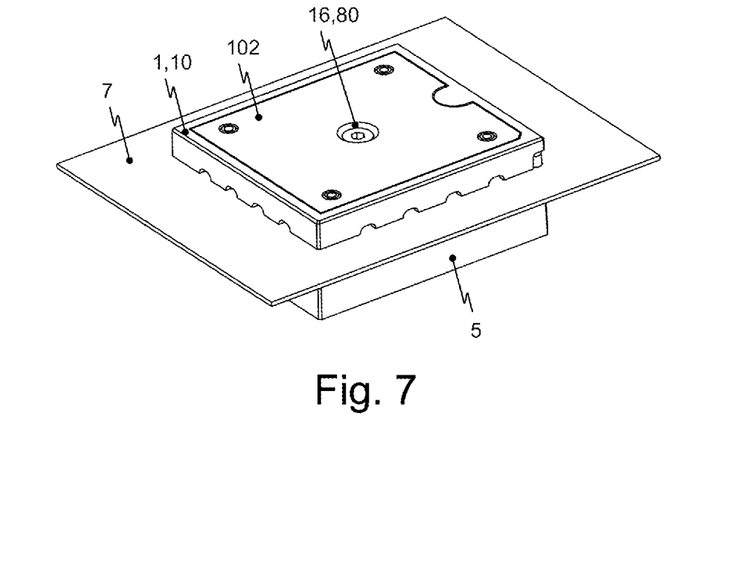
FIG. 7 shows an arrangement according to the invention in a three-dimensional view.

FIG. 7 shows a first arrangement according to the invention in a three-dimensional view without a cooling device. Pressure application body 1 is illustrated with a first partial body 10 and metallic reinforcement structure, which is embodied here as a planar metal plate 102 which is arranged in a cutout in the first partial body 10. A screw 80 extends as a clamping device through this metal plate 102 and therefore also through a cutout 16 in the first partial body 10. This screw 80 extends further through the cutouts in circuit board 7 and housing 5 together with the circuit carrier (not shown), cf. FIG. 1.

In the preceding Detailed Description, reference was made to the accompanying drawings, which form a part of this disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module comprising:
   a pressure application body having a first rigid partial body and a second elastic partial body;
   a circuit carrier having at least one conductor track;
   a power semiconductor component arranged on said at least one conductor track;
   an internal connecting device for connecting said power semiconductor component and said at least one conductor track; and
   a housing having a guide device arranged therein, a cutout therein and a connecting element;
   wherein said connecting element is embodied as a bolt with first and second end sections and an intermediate section therebetween;
   wherein said first end section is disposed on said circuit carrier and is electrically conductively connected thereto;
   wherein said second end section projects out of said cutout;
   wherein said connecting element is arranged in said guide device; and
   wherein said second partial body of said pressure application body protrudes out of said first partial body towards said housing and is configured to apply pressure to a circuit board when the circuit board is arranged between said pressure application body and said housing together with said connecting element and therefore also between said second partial body and said second end section of said connecting element.

2. The power semiconductor of claim 1, wherein said intermediate section of said connecting element has a cross-sectional area between about 0.5 mm$^2$ and about 10 mm$^2$.

3. The power semiconductor of claim 2, wherein said intermediate section of said connecting element has a cross-sectional area between about 0.75 mm$^2$ and about 5 mm$^2$.

4. The power semiconductor claim 1, wherein at least one of said first and second end sections of said connecting element has a contact face with a surface shape which is embodied in one of a planar and convex fashion.

5. The power semiconductor of claim 4, wherein said contact face has a structured surface.

6. The power semiconductor of claim 5, wherein said structured surface of said contact face has a concentric annular structure.

7. The power semiconductor of claim 1 wherein at least one of said first and second end sections of said connecting element has a substantially mushroom-like shape.

8. The power semiconductor as in one of claims 1-7, in which said connecting element is formed of one of copper and an alloy which mainly contains copper, and has a surface coating made of one of silver and an alloy which mainly contains silver.

9. The power semiconductor of claim 1,
wherein said guide device is configured to clamp said connecting element so that said connecting element is secured against dropping out; and
wherein said guide device has at least one clamping devices with clamping faces which clamp said connecting element at its intermediate section.

10. The power semiconductor device of claim 9, wherein said guide device has three clamping devices with clamping faces which clamp said connecting element at its intermediate section.

11. The power semiconductor of claim 1, wherein said first partial body of said pressure application body has a cutout through which said second partial body protrudes.

12. The power semiconductor of claim 1, wherein said first partial body of said pressure application body is composed of a first insulating material, and said second partial body is composed of a second insulating material.

13. The power semiconductor of claim 12, wherein said first insulating material is a high-temperature-resistant thermoplastic, and said second insulating material is silicone rubber.

14. The power semiconductor of claim 13, wherein said high-temperature-resistant thermoplastic is polyphenylenesulphide and said first partial body has a metallic reinforcement structure, and said silicone rubber is liquid silicone.

15. The power semiconductor of claim 1, wherein said second partial body of said pressure application body is arranged substantially flush with said guide device.

16. The power semiconductor of claim 1, wherein a pressure-transmitting element, which is embodied so as to be substantially identical to said connecting element, but made from an electrically insulating material, is configured in a further guide device.

17. An arrangement comprising:
a power semiconductor module comprising:
a pressure application body having a first rigid partial body and a second elastic partial body;
a circuit carrier having at least one conductor track;
a power semiconductor component arranged on said at least one conductor track;
an internal connecting device for connecting said power semiconductor component and said at least one conductor track; and
a housing having a guide device arranged therein, a cutout therein and a connecting element;
wherein said connecting element is embodied as a bolt with first and second end sections and an intermediate section therebetween;
wherein said first end section is disposed on said circuit carrier and is electrically conductively connected thereto;
wherein said second end section projects out of said cutout;
wherein said connecting element is arranged in said guide device; and
wherein said second partial body of said pressure application body protrudes out of said first partial body towards said housing and is configured to apply pressure to a circuit board when the circuit board is arranged between said pressure application body and said housing together with said connecting element and therefore also between said second partial body and said second end section of said connecting element;
a cooling device;
a circuit board; and
a clamping device for pressure-connecting said power semiconductor module, said cooling device and said circuit board;
wherein said circuit carrier is pressure-contacted to said cooling device, and is therefore connected thereto in a thermally conductive fashion, and
wherein said second end section of said connecting element is connected in a mechanically and electrically conductive and pressure-contacted fashion to a second conductor track of said circuit board.

18. The arrangement of claim 17, wherein said second partial body of said pressure application body is arranged substantially flush with said guide device.

19. The arrangement of claim 17,
wherein said pressure application body, said circuit board, said housing and said circuit carrier each have a continuous cutout therein, and said cooling device has a cutout with an internal thread; and
wherein said clamping device is embodied as a screw and extends through said cutouts in said pressure application body, said circuit board, said housing and said circuit carrier and is screwed to said internal thread;
whereby pressure is applied to said pressure application body, and on via said second partial body to said circuit board, and from said circuit board to said second end section, in direct mechanical and electrical contact with said circuit board, of said connecting element and from said first end section thereof to said circuit carrier which is in direct mechanical and electrical contact therewith, and on to the cooling device.

20. The arrangement of claim 17, wherein said pressure application body, said circuit board, said housing together with said circuit carrier and said cooling device are clamped by at least two clamping springs which are supported in said cooling device, whereby pressure is applied to said pressure application body and on via said second partial body to said circuit board, and from said circuit board to said second end section, in direct mechanical and electrical contact with said circuit board, of said connecting element, and from said first end section thereof to said circuit carrier which is in direct mechanical and electrical contact therewith, and on to said cooling device.

* * * * *